(12) United States Patent
Chu

(10) Patent No.: US 10,847,534 B2
(45) Date of Patent: Nov. 24, 2020

(54) STAIRCASE STRUCTURES FOR THREE-DIMENSIONAL MEMORY DEVICE DOUBLE-SIDED ROUTING

(71) Applicant: YANGTZE MEMORY TECHNOLOGIES CO., LTD., Wuhan (CN)

(72) Inventor: Shao-Fu Sanford Chu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/138,994

(22) Filed: Sep. 22, 2018

(65) Prior Publication Data

US 2020/0006377 A1 Jan. 2, 2020

Related U.S. Application Data

(63) Continuation of application No. PCT/CN2018/093257, filed on Jun. 28, 2018.

(51) Int. Cl.
*H01L 27/11582* (2017.01)
*H01L 23/522* (2006.01)
(Continued)

(52) U.S. Cl.
CPC ...... *H01L 27/11582* (2013.01); *H01L 23/528* (2013.01); *H01L 23/5226* (2013.01); *H01L 27/1157* (2013.01); *H01L 27/11565* (2013.01)

(58) Field of Classification Search
None
See application file for complete search history.

(56) References Cited

U.S. PATENT DOCUMENTS 9,281,315 B1  3/2016 Yeh et al.
9,437,483 B2  9/2016 Lee et al.
(Continued)

FOREIGN PATENT DOCUMENTS

CN  100511648 C  7/2009
CN  105636775 A  6/2016
(Continued)

OTHER PUBLICATIONS

International Search Report issued in corresponding International Application Na PCT/CN2018/093257, dated Mar. 21, 2019, 5 pages.
(Continued)

*Primary Examiner* — Abul Kalam
(74) *Attorney, Agent, or Firm* — Bayes PLLC

(57) ABSTRACT

Embodiments of staircase structures for three-dimensional (3D) memory devices double-sided routing are disclosed. In an example, a 3D memory device includes a substrate, a memory stack disposed above the substrate and including conductor/dielectric layer pairs stacked alternatingly, and an array of memory strings each extending vertically through an inner region of the memory stack. An outer region of the memory stack includes a first staircase structure disposed on the substrate and a second staircase structure disposed above the first staircase structure. First edges of the conductor/dielectric layer pairs in the first staircase structure along a vertical direction away from the substrate are staggered laterally away from the array of memory strings. Second edges of the conductor/dielectric layer pairs in the second staircase structure along the vertical direction away from the substrate are staggered laterally toward the array of memory strings.

20 Claims, 12 Drawing Sheets

(51) Int. Cl.
*H01L 23/528* (2006.01)
*H01L 27/11565* (2017.01)
*H01L 27/1157* (2017.01)

(56) References Cited

U.S. PATENT DOCUMENTS

| | | | |
|---|---|---|---|
| 9,530,670 B2 | 12/2016 | Han et al. | |
| 9,911,750 B2 | 3/2018 | Lee | |
| 10,049,744 B2* | 8/2018 | Jeong | H01L 21/76877 |
| 10,304,852 B1* | 5/2019 | Cui | H01L 23/528 |
| 10,453,860 B1* | 10/2019 | Xiao | H01L 27/11575 |
| 10,483,280 B1* | 11/2019 | Xiao | H01L 27/11565 |
| 2009/0111255 A1 | 4/2009 | Eun et al. | |
| 2013/0161821 A1 | 6/2013 | Hwang et al. | |
| 2016/0233229 A1 | 8/2016 | Oh et al. | |
| 2016/0307917 A1* | 10/2016 | Yada | H01L 21/02164 |
| 2016/0358855 A1 | 12/2016 | Oh | |
| 2017/0179026 A1* | 6/2017 | Toyama | H01L 27/11524 |
| 2017/0207221 A1* | 7/2017 | Kim | H01L 27/1052 |
| 2017/0236746 A1 | 8/2017 | Yu et al. | |
| 2017/0256551 A1 | 9/2017 | Lee | |
| 2018/0026045 A1 | 1/2018 | Hu | |
| 2018/0130700 A1 | 5/2018 | Ha et al. | |

FOREIGN PATENT DOCUMENTS

| | | |
|---|---|---|
| CN | 106145694 A | 11/2016 |
| CN | 106746729 A | 5/2017 |
| CN | 107230658 A | 10/2017 |
| CN | 107431063 A | 12/2017 |
| CN | 107579070 A | 1/2018 |
| CN | 107658309 A | 2/2018 |
| CN | 107658315 A | 2/2018 |
| CN | 107706182 A | 2/2018 |
| CN | 107771356 A | 3/2018 |
| CN | 108140644 A | 6/2018 |
| CN | 109314114 A | 2/2019 |
| KR | 20080013243 A | 2/2008 |
| KR | 10-2012-0075882 A | 7/2012 |
| TW | 201428952 A | 7/2014 |
| TW | 201814839 A | 4/2018 |

OTHER PUBLICATIONS

Written Opinion of the International Searching Authority issued in corresponding International Application No. PCT/CN2018/093257, dated Mar. 21, 2019, 4 pages.

International Search Report issued in corresponding International Application No. PCT/CN2018/093303, dated Mar. 18, 2019, 5 pages.

Written Opinion of the International Searching Authority issued in corresponding International Application No. PCT/CN2018/093303, dated Mar. 15, 2019, 6 pages.

* cited by examiner

STAIRCASE STRUCTURES FOR THREE-DIMENSIONAL MEMORY DEVICE DOUBLE-SIDED ROUTING

CROSS REFERENCE TO RELATED APPLICATION

This application is continuation of International Application No. PCT/CN2018/093257, filed on Jun. 28, 2018, entitled "STAIRCASE STRUCTURES FOR THREE-DIMENSIONAL MEMORY DEVICE DOUBLE-SIDED ROUTING," which is hereby incorporated by reference in its entirety. This application is also related to U.S. application Ser. No. 16/138,992, filed on even date, entitled "METHOD OF FORMING STAIRCASE STRUCTURES FOR THREE-DIMENSIONAL MEMORY DEVICE DOUBLE-SIDED ROUTING," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of staircase structures for 3D memory device double-sided routing are disclosed herein.

In one example, a 3D memory device includes a substrate, a memory stack disposed above the substrate and including a plurality of conductor/dielectric layer pairs stacked alternatingly, and an array of memory strings each extending vertically through an inner region of the memory stack. An outer region of the memory stack includes a first staircase structure disposed on the substrate and a second staircase structure disposed above the first staircase structure. First edges of the plurality of conductor/dielectric layer pairs in the first staircase structure along a vertical direction away from the substrate are staggered laterally away from the array of memory strings. Second edges of the plurality of conductor/dielectric layer pairs in the second staircase structure along the vertical direction away from the substrate are staggered laterally toward the array of memory strings.

In another example, a 3D memory device includes a substrate, a memory stack disposed above the substrate and including a plurality of conductor/dielectric layer pairs stacked alternatingly, and an array of memory strings each extending vertically through an inner region of the memory stack. An outer region of the memory stack includes a first staircase structure disposed on the substrate and a second staircase structure disposed on the substrate. First edges of the plurality of conductor/dielectric layer pairs in the first staircase structure along a vertical direction away from the substrate are staggered laterally away from the array of memory strings. Second edges of the plurality of conductor/ dielectric layer pairs in the second staircase structure along the vertical direction away from the substrate are staggered laterally away from the array of memory strings.

In still another example, a 3D memory device includes a substrate, a memory stack disposed above the substrate, and an array of memory strings each extending vertically through the memory stack. The memory stack includes a plurality of conductor/dielectric layer pairs stacked alternatingly. A length of each of the conductor/dielectric layer pairs decreases from a middle conductor/dielectric layer pair toward a top conductor/dielectric layer and a bottom conductor/dielectric layer pair, respectively.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
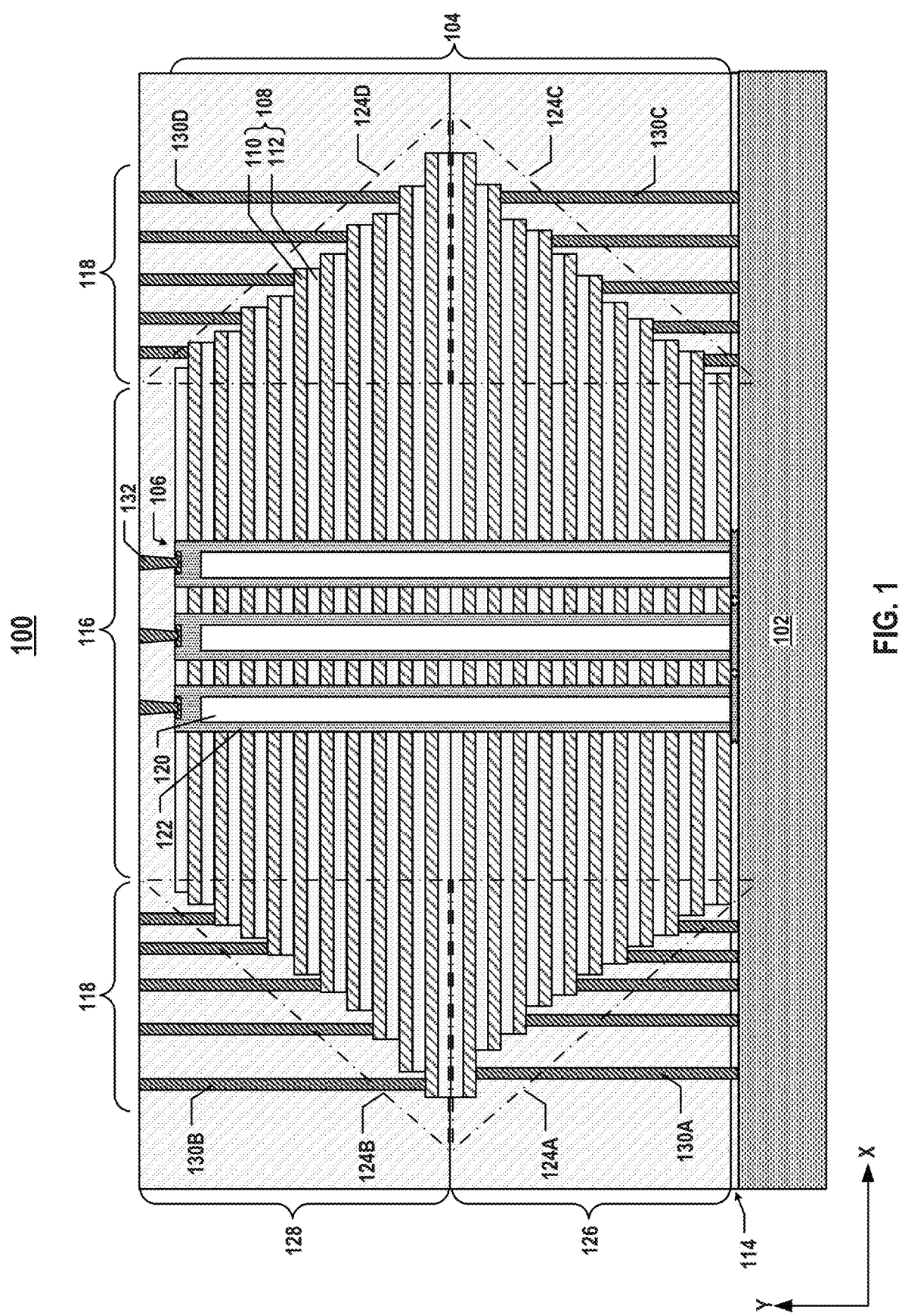
FIG. 1 illustrates a cross-section of an exemplary 3D memory device having staircase structures for double-sided routing, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides of the stacked storage structure for purposes such as word line fan-out. As the demand for higher storage capacity continues to increase, the number of vertical levels of the stacked storage structure also increases. The conventional staircase structures allow word line fan-out toward only one side of the substrate. That is, all the word line contacts have to land on the conventional staircases along the same vertical direction, which constrains interconnect routing and results in higher interconnect density and smaller process window.

Various embodiments in accordance with the present disclosure provide a 3D memory device having staircase structures for double-sided routing. The staircase structures disclosed herein allow interconnect routing (e.g., word line fan-out) toward both sides of the device substrate, thereby increasing routing flexibility, reducing interconnect density, and enlarging process window. In some embodiments, double-sided routing of a 3D memory device may also eliminate the need of certain interconnect structures with high aspect ratios, such as through array contacts (TACs), in the 3D memory device for back-end-of-line (BEOL) interconnects, which can further improve device yield.

FIG. 1 illustrates a cross-section of an exemplary 3D memory device 100 having staircase structures for double-sided routing, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials. In some embodiments, substrate 102 is a thinned substrate (e.g., a semiconductor layer), which was thinned from a normal thickness by grinding, wet/dry etching, chemical mechanical polishing (CMP), or any combination thereof.

3D memory device 100 can include a memory stack 104 above substrate 102. Memory stack 104 can be a stacked storage structure through which memory strings (e.g., NAND memory strings 106) are formed. In some embodiments, memory stack 104 includes a plurality of conductor/dielectric layer pairs 108 stacked vertically above substrate 102. Each conductor/dielectric layer pair 108 can include a conductor layer 110 and a dielectric layer 112. That is, memory stack 104 can include interleaved conductor layers 110 and dielectric layers 112 stacked vertically. As shown in FIG. 1, each NAND memory string 106 extends vertically through conductor/dielectric layer pairs 108 in memory stack 104. In some embodiments, 3D memory device 100 is a NAND Flash memory device in which memory cells are provided at intersections of NAND memory strings 106 and conductor layers 110 (functioning as word lines) of 3D memory device 100. The number of conductor/dielectric layer pairs 108 in memory stack 104 (e.g., 32, 64, 96, or 128) can set the number of memory cells in 3D memory device 100.

Conductor layers 110 can each have the same thickness or have different thicknesses. Similarly, dielectric layers 112 can each have the same thickness or have different thicknesses. Conductor layers 110 can include conductive materials including, but not limited to, tungsten (W), cobalt (Co), copper (Cu), aluminum (Al), polycrystalline silicon (polysilicon), doped silicon, silicides, or any combination thereof. Dielectric layers 112 can include dielectric materials including, but not limited to, silicon oxide, silicon nitride, silicon oxynitride, or any combination thereof. In some embodiments, conductor layers 110 include metal layers, such as W, and dielectric layers 112 include silicon oxide. It is understood that a silicon oxide film 114, such as an in-situ steam generation (ISSG) silicon oxide, is formed between substrate 102 (e.g., a silicon substrate) and memory stack 104, according to some embodiments.

It is noted that x and y axes are added to FIG. 1 to further illustrate the spatial relationship of the components in 3D memory device 100. Substrate 102 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is part of a monolithic 3D memory device, in which the components of the monolithic 3D memory device (e.g., memory cells and peripheral devices) are formed on a single substrate (e.g., substrate 102). Peripheral devices (not shown), such as any suitable digital, analog, and/or mixed-signal peripheral circuits used for facilitating the operation of 3D memory device 100, can be formed above memory stack 104. In some embodiments, 3D memory device 100 is part of a non-monolithic 3D memory device, in which the components are formed separately on different substrates and then bonded in a face-to-face manner, a face-to-back manner, or a back-to-back manner Peripheral devices (not shown) can be formed on a separate substrate different from substrate 102. As part of a bonded non-monolithic 3D memory device, substrate 102 can be a thinned substrate (e.g., a semiconductor layer, which is not the substrate of the bonded non-monolithic 3D memory device), and the BEOL interconnects of the non-monolithic 3D memory device can be formed on the backside of thinned substrate 102.

Nevertheless, 3D memory device 100 can be part of a monolithic or non-monolithic 3D memory device regardless of whether 3D memory device 100 is above or below the peripheral devices (not shown). For ease of reference, FIG. 1 depicts a state of 3D memory device 100 in which substrate 102 is positioned below memory stack 104 in the y-direction, regardless of whether substrate 102 is a thinned substrate on which the BEOL interconnects of 3D memory device 100 can be formed.

As shown in FIG. 1, memory stack 104 can include an inner region 116 (also known as a "core array region") and an outer region 118 (also known as a "staircase region"). In some embodiments, inner region 116 is the center region of memory stack 104 where an array of NAND memory strings 106 are formed through conductor/dielectric layer pairs 108, and outer region 118 is the remaining region of memory stack 104 surrounding inner region 116 (including the sides and edges) without NAND memory strings 106. As shown in the plan view of FIG. 2, memory stack 104 can have a rectangle (or square) shape with inner region 116 in the center and outer region 118 (including the four sides and edges) surrounding inner region 116.

As shown in FIG. 1, each NAND memory string 106 can extend vertically through inner region 116 of memory stack 104. Each NAND memory string 106 can include a channel hole filled with semiconductor materials (e.g., forming a semiconductor channel 120) and dielectric materials (e.g., forming a memory film 122). In some embodiments, semiconductor channel 120 includes silicon, such as amorphous silicon, polysilicon, or single crystalline silicon. In some embodiments, memory film 122 is a composite layer including a tunneling layer, a storage layer (also known as a "charge trap/storage layer"), and a blocking layer. Each NAND memory string 106 can have a cylinder shape (e.g., a pillar shape). Semiconductor channel 120, the tunneling layer, the storage layer, and the blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 106 include a plurality of control gates (each being part of a word line/conductor layer 110) for NAND memory strings 106. Conductor layer 110 in each conductor/dielectric layer pair 108 can function as a control gate for memory cells of NAND memory string 106. Conductor layer 110 can include multiple control gates for multiple NAND memory strings 106 and can extend laterally as a word line ending at the edge of memory stack 104. It is understood that although not shown in FIG. 1, additional components of 3D memory device 100 can be formed as part of NAND memory strings 106 and/or memory stack 104 including, but not limited to, array common sources, drains, source select gates, drain select gates, and gate line slits/source contacts.

As shown in FIG. 1, at least on two sides in the lateral direction, outer region 118 of memory stack 104 can include multiple staircase structures 124. In some embodiments, memory stack 104 includes a first staircase structure 124A on substrate 102 and a second staircase structure 124B above first staircase structure 124A on one side and a third staircase structure 124C on substrate 102 and a fourth staircase structure 124D above third staircase structure 124C on another side. That is, memory stack 104 can include a lower deck 126 and an upper deck 128, with first and third staircase structures 124A and 124C in lower deck 126 and second and fourth staircase structures 124B and 124D in upper deck 128.

In each staircase structure 124A or 124C in lower deck 126, corresponding edges of conductor/dielectric layer pairs 108 along the vertical direction away from substrate 102 (the positive y-direction) can be staggered laterally away from array of NAND memory strings 106 of memory stack 104.

In other words, the edges of memory stack 104 in staircase structures 124A and 124C in lower deck 126 can be tilted away from inner region 116 as moving away from substrate 102 (from bottom to top). In some embodiments, the length of conductor/dielectric layer pairs 108 in lower deck 126 of memory stack 104 decreases from the top to the bottom.

On the other hand, in each staircase structure 124B or 124D in upper deck 128, corresponding edges of conductor/dielectric layer pairs 108 along the vertical direction away from substrate 102 (the positive y-direction) can be staggered laterally toward array of NAND memory strings 106 of memory stack 104. In other words, the edges of memory stack 104 in staircase structures 124B and 124D in upper deck 128 can be tilted toward inner region 116 as moving away from substrate 102 (from bottom to top). In some embodiments, the length of conductor/dielectric layer pairs 108 in upper deck 128 of memory stack 104 increases from the bottom to the top.

Consequently, as shown in FIG. 1, memory stack 104 can have a substantially hexagon shape in the side view (disregarding the "sawtooth" on the sides). The length of each conductor/dielectric layer pair 108 can decrease from the middle toward the top and the bottom, respectively. For example, the length of each conductor/dielectric layer pair 108 decreases from a middle conductor/dielectric layer pair toward a top conductor/dielectric layer pair and also decreases from a middle conductor/dielectric layer pair toward a bottom conductor/dielectric layer pair, as shown in FIG. 1. One or more conductor/dielectric layer pairs in the middle of memory stack 104 can have the largest length. In some embodiments, conductor/dielectric layer pairs 108 in each of lower and upper decks 126 and 128 are vertically symmetric. For example, the numbers of conductor/dielectric layer pairs 108 in first and third staircase structures 124A and 124C in lower deck 126 are the same, and the numbers of conductor/dielectric layers pairs 108 in second and fourth staircase structures 124B and 124D in upper deck 128 are the same. In some embodiments, conductor/dielectric layer pairs 108 in lower and upper decks 126 and 128 are laterally symmetric. For example, the numbers of conductor/dielectric layer pairs 108 in first and second staircase structures 124A and 124B are the same, and the numbers of conductor/dielectric layer pairs 108 in third and fourth staircase structures 124C and 124D are the same.

Each "level" of staircase structure 124 can include one or more conductor/dielectric layer pairs 108, each including a pair of conductor layer 110 and dielectric layer 112. As shown in FIG. 1, each level of staircase structure 124 includes one conductor/dielectric layer pair 108, according to some embodiments. Each adjacent conductor/dielectric layer pairs 108 can have different lengths, and their edges are staggered laterally. For example, the edges of each adjacent conductor/dielectric layer pairs 108 in first or third staircase structure 124A or 124C in lower deck 126 from bottom to top are staggered laterally away from array of NAND memory strings 106, and the edges of each adjacent conductor/dielectric layer pairs 108 in second or fourth staircase structure 124B or 124D in upper deck 128 from bottom to top are staggered laterally toward NAND memory strings 106. It is understood that in some embodiments, each level of staircase structure 124 can include multiple conductor/dielectric layer pairs 108 each having nominally the same length.

In some embodiments, the top layer in each level of staircase structure 124 (e.g., each conductor/dielectric layer pair 108 in FIG. 1) is conductor layer 110 for interconnection in the vertical directions. In some embodiments, each two adjacent levels of staircase structure 124 are offset by a nominally same distance in the vertical direction and a nominally same distance in the lateral direction. Each offset thus can form a "landing area" for interconnection with the word lines of 3D memory device 100 in the vertical direction. As shown in FIG. 1, the offset of the edges of each adjacent conductor/dielectric layer pairs 108 in each staircase structure 124A, 124B, 124C, or 124D is nominally the same, according to some embodiments.

Figure 2:
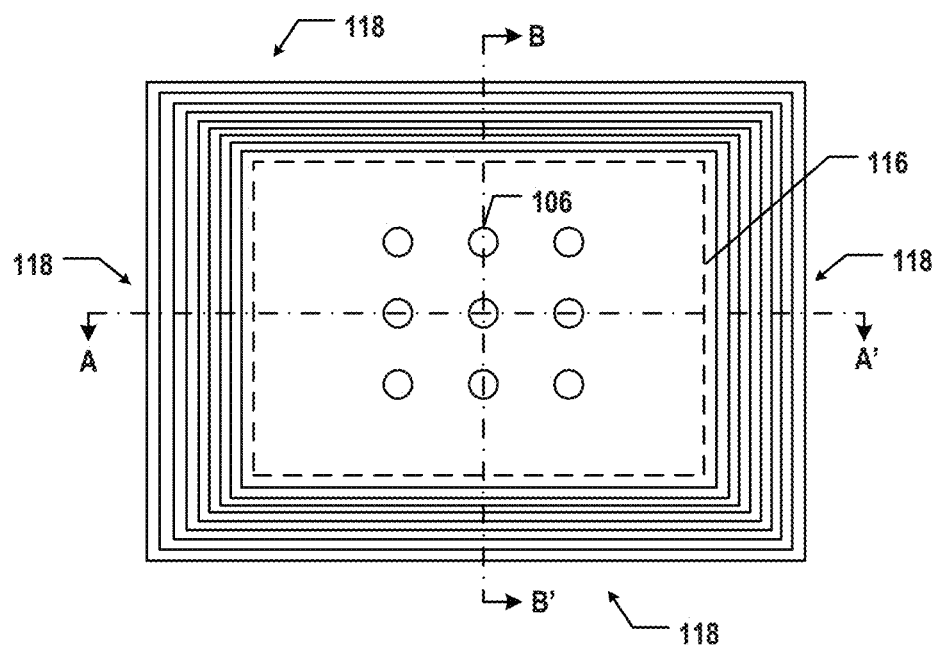
FIG. 2 illustrates a plan view of an exemplary memory stack in a 3D memory device, according to some embodiments.

Referring to the plan view of FIG. 2, memory stack 104 has staircase structures on four sides of outer region 118, according to some embodiments. FIG. 1 illustrates the cross-section of memory stack 104 along the A-A' direction with four staircase structures 124A-124D on two opposite sides. In some embodiments, outer region 118 of memory stack 104 further includes four staircase structures along the B-B' direction on another two opposite sides, which have the similar design and configuration as staircase structures 124A-124D in FIG. 1. For example, the cross-section of memory stack 104 along the B-B' direction can also have a substantially hexagon shape in the side view. The details of the four staircase structures along the B-B' direction will not be repeated. A staircase structure can be either a functional staircase structure used for landing interconnects (e.g., via contacts) and/or dummy channel holes or a dummy staircase structure used for balancing load in etch/CMP processes during fabrication. In some embodiments, the staircase structures along the A-A' direction (e.g., staircase structures 124A-124D in FIG. 1) are functional staircase structures, while the staircase structures along the B-B's direction are dummy staircase structures.

Referring back to FIG. 1, 3D memory device 100 can include a plurality of local interconnects in contact with the various memory stack components disclosed herein, such as NAND memory strings 106 and word lines 110 in staircase structures 124. The interconnects are referred to herein as "local interconnects" as they are in contact with the components in memory stack 104 directly for fan-out. As used herein, the term "interconnects" can broadly include any suitable types of interconnects, including vertical interconnect access (e.g., via) contacts and lateral interconnect lines. As shown in FIG. 1, local interconnects can include word line via contacts 130 and NAND memory string via contacts 132. Each local interconnect can include an opening (e.g., a via hole or a trench) filled with conductive materials including, but not limited to, W, Co, Cu, Al, silicides, or any combination thereof.

The hexagon-shaped memory stack 104 shown in FIG. 1 can allow double-sided interconnect routing for 3D memory device 100, such as double-sided word line fan-out using staircase structures 124 in both lower and upper decks 126 and 128. Interconnect routing thus can be achieved at opposite sides of substrate 102. In some embodiments, word line via contacts 130 include a first set of word line via contacts 130A and a third set of word line via contacts 130C for word line fan-out in lower deck 126 toward substrate 102 (the negative y-direction) and include a second set of word line via contacts 130B and a fourth set of word line via contacts 130D for word line fan-out in upper deck 128 away from substrate 102 (the positive y-direction). For first and third sets of word line via contacts 130A and 130C, each of them can be in contact with conductor layer 110 (word line) in one of conductor/dielectric layer pairs 108 in respective staircase structure 124A or 124C in lower deck 126. Similarly, for second and fourth sets of word line via contacts 130B and 130D, each of them can be in contact with conductor layer 110 (word line) in one of conductor/dielectric layer pairs 108 in respective staircase structure 124B or 124D in upper deck 128.

As each word line 110 can be fanned-out by one of the staircase structures on either side of the same deck, for each staircase structure 124, not all of the landing areas need to be used for contacting word line via contact 130. In some embodiments, each staircase structure 124 is used to fan-out one half of word lines 110 in the corresponding deck. For example, word lines 110 can be alternatingly fanned-out by two staircase structures 124 in the same deck.

The hexagon-shaped memory stack 104 shown in FIG. 1 can allow double-sided interconnect routing for 3D memory device 100, which in turn can allow interconnect layers (e.g., BEOL interconnects) at either one or both sides of substrate 102 to be electrically connected to the components (e.g., word lines 110) in memory stack 104 by the local interconnects (e.g., word line via contacts 130). For example, FIGS. 3A-3B illustrate cross-sections of 3D memory device 100 having staircase structures 124 for double-sided routing to interconnect layers, according to various embodiments.

Figure 3A:
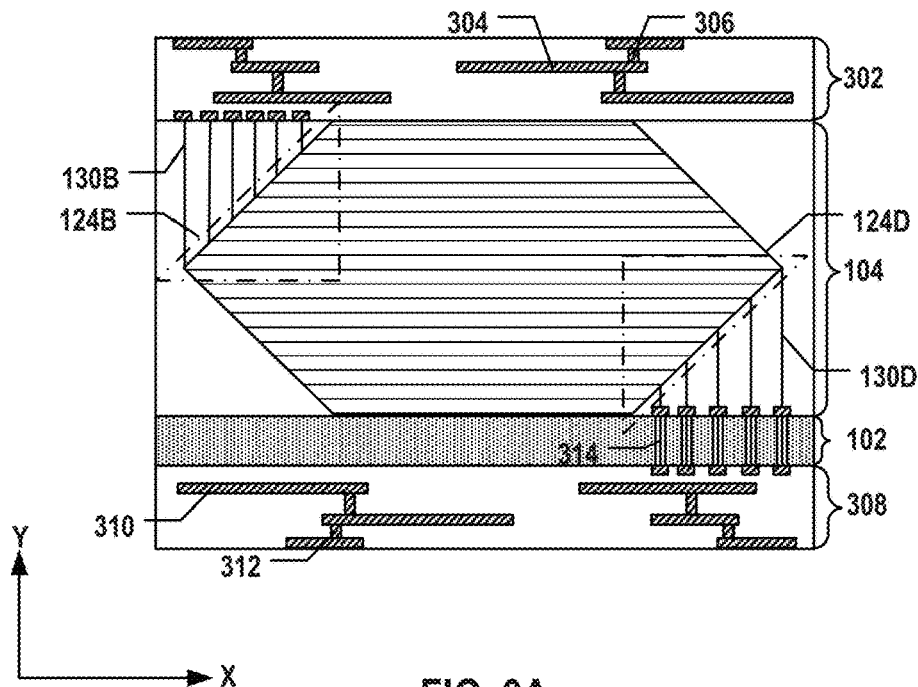
FIG. 3A illustrates a cross-section of an exemplary 3D memory device having staircase structures for double-sided routing to interconnect layers, according to some embodiments.
Figure 3B:
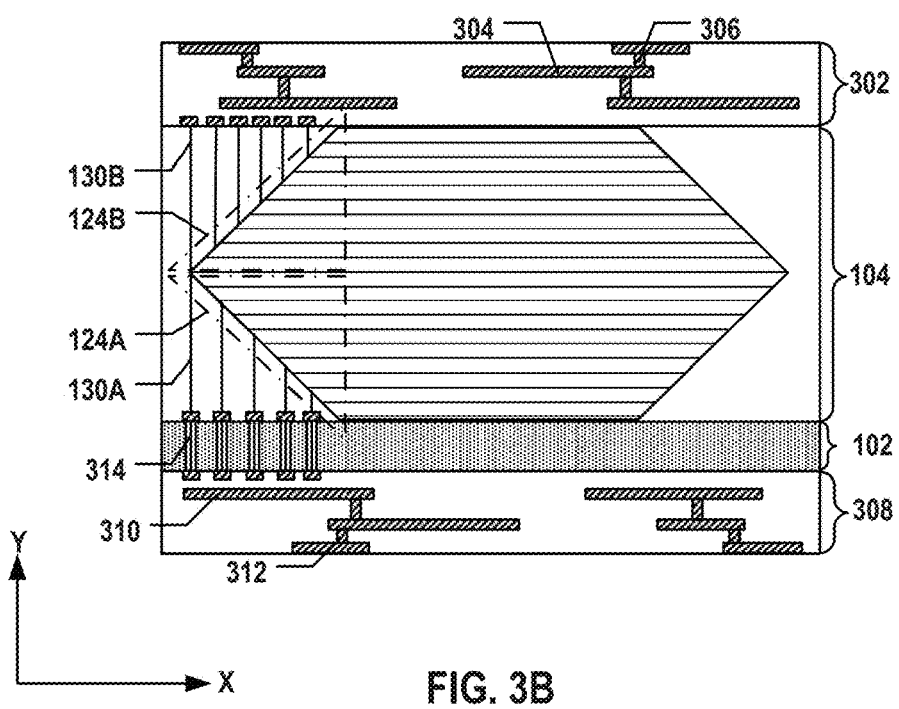
FIG. 3B illustrates a cross-section of another exemplary 3D memory device having staircase structures for double-sided routing to interconnect layers, according to some embodiments.

As shown in FIG. 3A, 3D memory device 100 can include a front-side interconnect layer 302 above memory stack 104 and at the front side of substrate 102 where memory stack 104 is formed. Front-side interconnect layer 302 can include interconnect lines 304 and via contacts 306 and one or more interlayer dielectric (ILD) layers (also known as "intermetal dielectric (IMD) layers") in which interconnect lines 304 and via contacts 306 can form. The interconnects (e.g., interconnect lines 304 and via contacts 306) and the ILD layers can be collectively referred to herein as an "interconnect layer" (e.g., front-side interconnect layer 302). Interconnect lines 304 and via contacts 306 can include conductive materials including, but not limited to, W, Co, Cu, Al, silicides, or any combination thereof. The ILD layers in front-side interconnect layer 302 can include dielectric materials including, but not limited to, silicon oxide, silicon nitride, silicon oxynitride, low dielectric constant (low-k) dielectrics, or any combination thereof.

In some embodiments, one end (e.g., the lower end) of each word line via contact 130B is in contact with a word line in staircase structure 124B, and another end (e.g., the upper end) of each word line via contact 130B is in contact with the interconnects in front-side interconnect layer 302. That is, front-side interconnect layer 302 can be electrically connected to the word lines in the upper deck of memory stack 104. As used herein, the "upper end" of a component (e.g., word line via contact 130) is the end farther away from substrate 102 in the y-direction, and the "lower end" of the component is the end closer to substrate 102 in the y-direction.

As shown in FIG. 3A, 3D memory device 100 can also include a back-side interconnect layer 308 below memory stack 104 and at the back side of substrate 102. That is, back-side interconnect layer 308 and memory stack 104 can be formed at opposite sides of substrate 102. Back-side interconnect layer 308 can include interconnect lines 310 and via contacts 312 and one or more ILD layers in which interconnect lines 310 and via contacts 312 can form. The interconnects (e.g., interconnect lines 310 and via contacts 312) and the ILD layers can be collectively referred to herein as an "interconnect layer" (e.g., back-side interconnect layer 308). Interconnect lines 310 and via contacts 312 can include conductive materials including, but not limited to, W, Co, Cu, Al, silicides, or any combination thereof. The ILD layers in back-side interconnect layer 308 can include dielectric materials including, but not limited to, silicon oxide, silicon nitride, silicon oxynitride, low k dielectrics, or any combination thereof.

In some embodiments, one end (e.g., the upper end) of each word line via contact 130D is in contact with a word line in staircase structure 124D, and another end (e.g., the lower end) of each word line via contact 130D is in contact with a via contact 314 extending through substrate 102 (e.g., a through silicon via (TSV)). Via contacts 314 can be in contact with the interconnects in back-side interconnect layer 308. As a result, back-side interconnect layer 308 can be electrically connected to the word lines in the lower deck of memory stack 104 by word line via contacts 130D and via contacts 314 through substrate 102. It is understood that in some embodiments, substrate 102 is a thinned substrate for ease of forming via contacts 314 and back-side interconnect layer 308.

In some embodiments, not all staircase structures 124A-124D need to be used for word line fan-out. Only one staircase structure 124 in each of lower deck 126 and upper deck 128 is used, according to some embodiments. In one example, FIG. 3A shows that only staircase structures 124B and 124D in different decks and on different sides of memory stack 104 are used for word line fan-out to interconnect layers 302 and 308 at different sides of substrate 102. It is understood that in some embodiments, only staircase structures 124A and 124C in different decks and on different sides of memory stack 104 are used for word line fan-out. In another example, FIG. 3B shows that only staircase structures 124A and 124B in different decks and on the same side of memory stack 104 are used for word line fan-out to interconnect layers 302 and 308 at different sides of substrate 102. It is understood that in some embodiments, only staircase structures 124C and 124D in different decks and on the same side of memory stack 104 are used for word line fan-out.

FIGS. 4A-4I illustrate a fabrication process for forming an exemplary 3D memory device having staircase structures for double-sided routing, according to some embodiments of the present disclosure. FIG. 5 is a flowchart of a method 500 for forming an exemplary 3D memory device having staircase structures for double-sided routing, according to some embodiments. Examples of the 3D memory device depicted in FIGS. 4A-4I and FIG. 5 include 3D memory device 100 depicted in FIG. 1. FIGS. 4A-4I and FIG. 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a first dielectric layer is formed on a substrate, and a first photoresist layer is formed on the first dielectric layer. The substrate can be a silicon substrate. In some embodiments, prior to forming the first dielectric layer, the substrate is doped by ion implantation and/or thermal diffusion to form doping regions (e.g., wells) and is oxidized to form a silicon oxide film (e.g., ISSG silicon oxide). In some embodiments, isolation regions (e.g., shallow trench isolations (STIs)) are also formed in the substrate by wet/dry etch and thin film deposition. Forming the first dielectric layer can include depositing a silicon oxide film on the substrate.

Figure 4A:
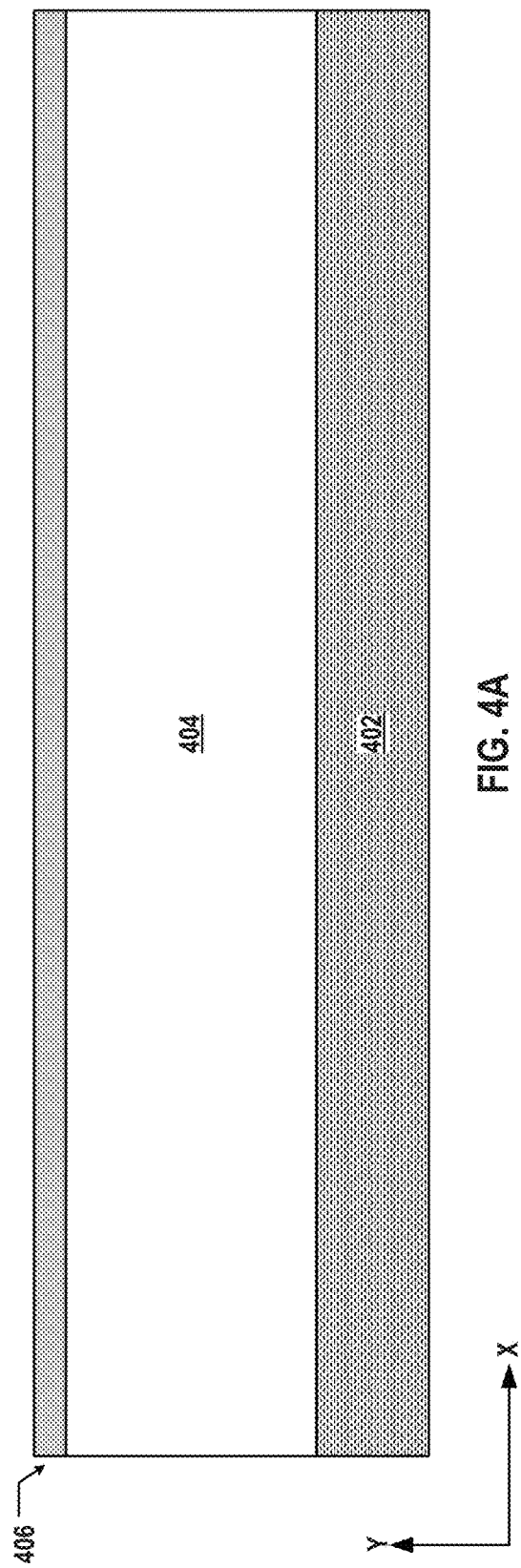
FIGS. 4A-4I illustrate a fabrication process for forming an exemplary 3D memory device having staircase structures for double-sided routing, according to some embodiments.
Figure 5:
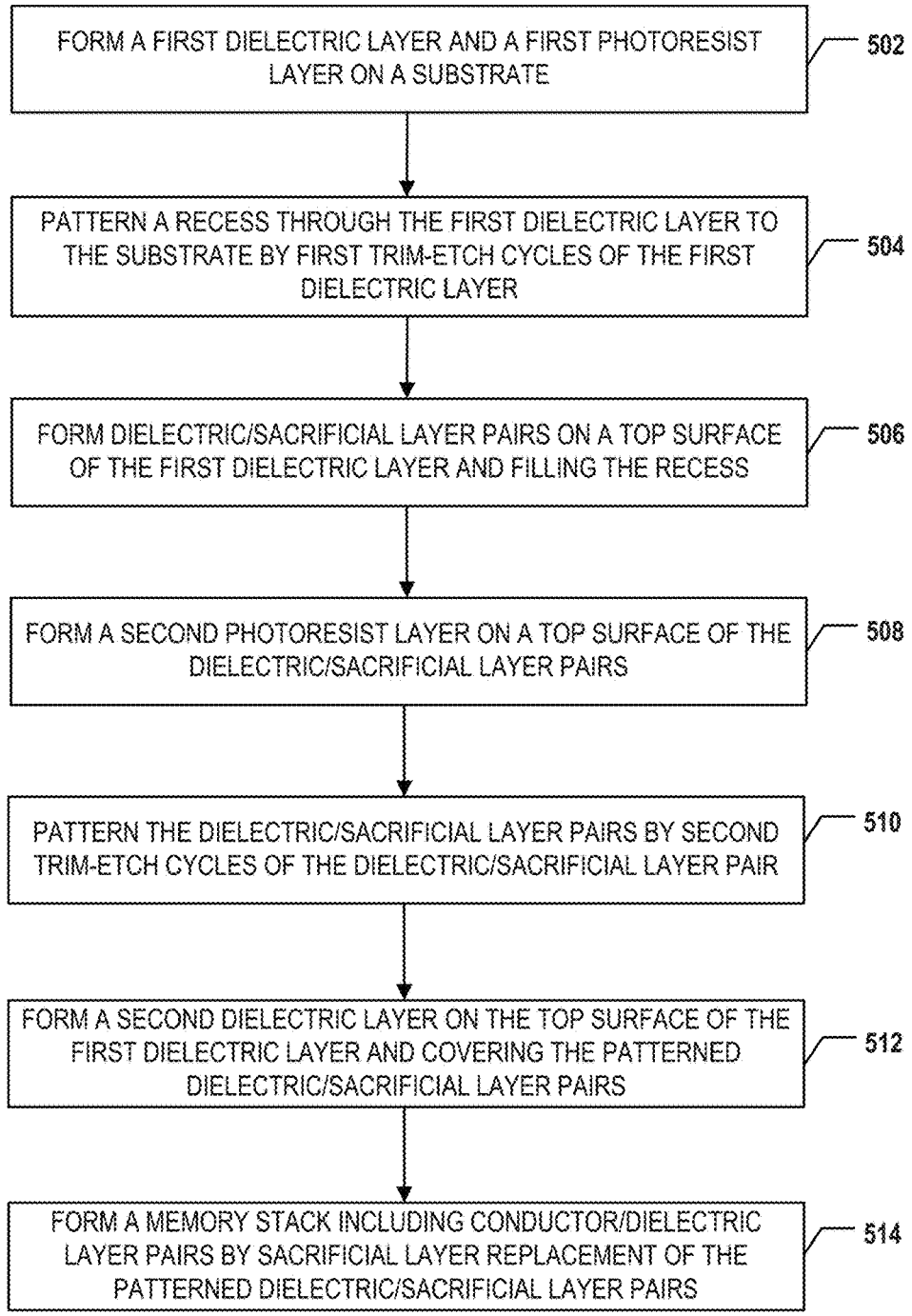
FIG. 5 is a flowchart of a method for forming an exemplary 3D memory device having staircase structures for double-sided routing, according to some embodiments.

As illustrated in FIG. 4A, a dielectric layer 404 is formed on a silicon substrate 402. Dielectric layer 404 can include silicon oxide, such as tetraethyl orthosilicate (TEOS) silicon oxide, or any other dielectric materials including, but not limited to, silicon nitride, silicon oxynitride, or any combination thereof. Dielectric layer 404 can be formed by one or more thin film deposition processes including, but not limited to, chemical vapor deposition (CVD), physical vapor deposition (PVD), atomic layer deposition (ALD), spin coating, or any combination thereof. A photoresist layer 406 is formed on dielectric layer 404 by spin coating. Photoresist layer 406 can be any suitable type of positive or negative photoresist. In some embodiments, an ISSG silicon oxide film is formed between dielectric layer 404 and silicon substrate 402, and a bottom anti-reflection coating (BARC) film is formed between dielectric layer 404 and photoresist layer 406.

Method 500 proceeds to operation 504, as illustrated in FIG. 5, in which a recess is patterned through the first dielectric layer to the substrate by a plurality cycles of trimming the first photoresist layer and etching the first dielectric layer. In some embodiments, patterning the recess includes patterning the first photoresist layer to expose a portion of the first dielectric layer, and etching the exposed portion of the first dielectric layer using the patterned first photoresist layer as an etch mask. In each trim-etch cycle, the first photoresist layer is trimmed to enlarge the exposed portion of the first dielectric layer, and the enlarged exposed portion of the first dielectric layer is etched using the trimmed first photoresist layer as another etch mask to form a step structure at an edge of the recess, according to some embodiments. The trim-etch cycle can be repeated until the etching reaches the substrate and results in a plurality of step structures at the edge of the recess. In some embodiments, the amount of the trimmed first photoresist layer is nominally the same in each trim-etch cycle, and the width of each step structure is nominally the same as well.

Figure 4B:
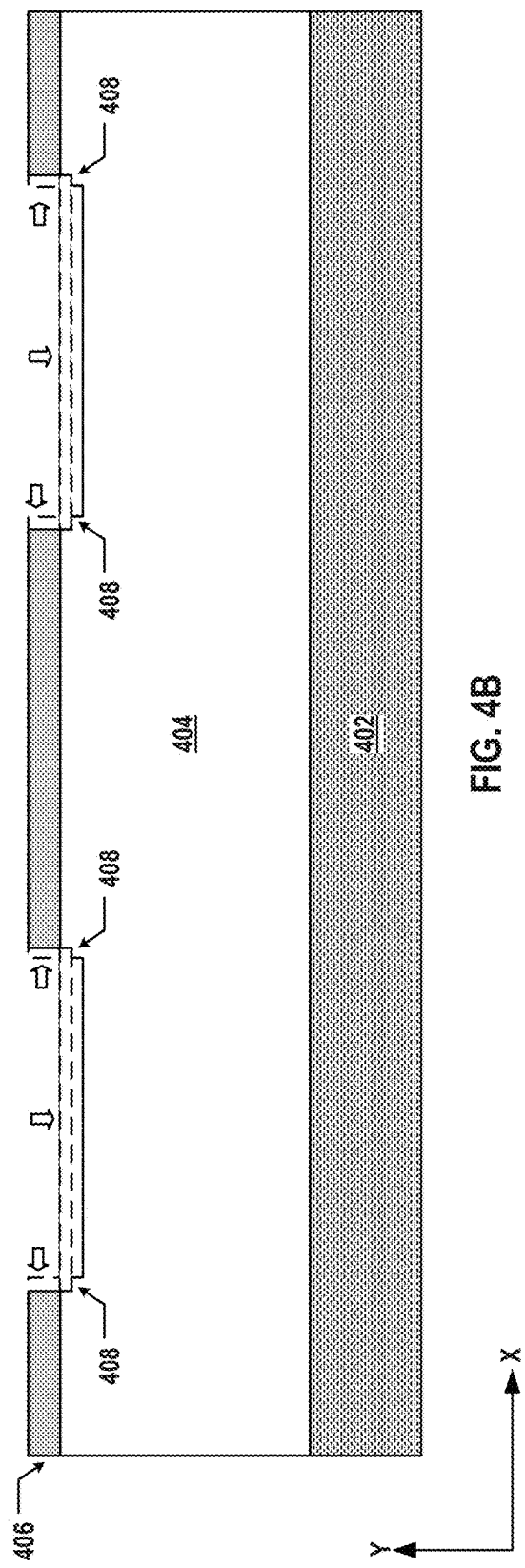

As illustrated in FIG. 4B, photoresist layer 406 is patterned to expose portions of dielectric layer 404. Photoresist layer 406 can be patterned by photolithography and development. Patterned photoresist layer 406 is used as an etch mask to etch the exposed portions of dielectric layer 404 by wet etch and/or dry etch. Any suitable etchants (e.g., of wet etch and/or dry etch) can be used to remove a certain thickness of dielectric layer 404 (and the entire thickness of BARC film if any) in the exposed portions. The etched thickness can be controlled by etch rate and/or etch time. Patterned photoresist layer 406 is then trimmed (e.g., etched incrementally and inwardly, often from all directions) to enlarge the exposed portions of dielectric layer 404 (as indicated by the lateral arrows). The amount of photoresist layer 406 trimmed can be controlled by trim rate and/or trim time and can be directly relevant (e.g., determinant) to the dimensions of the resulting step structures 408. The trim of photoresist layer 406 can be performed using any suitable etch process, e.g., an isotropic dry etch or a wet etch. The enlarged exposed portions of dielectric layer 404 are etched again using trimmed photoresist layer 406 as an etch mask to form one step structure 408. Any suitable etchants (e.g., of wet etch and/or dry etch) can be used to remove a certain thickness of dielectric layer 404 toward silicon substrate 402 (as indicated by the vertical arrows), which can be controlled by etch rate and/or etch time. The trim process of photoresist 406 followed by the etch process of dielectric layer 404 is referred to herein as a trim-etch cycle of dielectric layer 404.

Figure 4C:
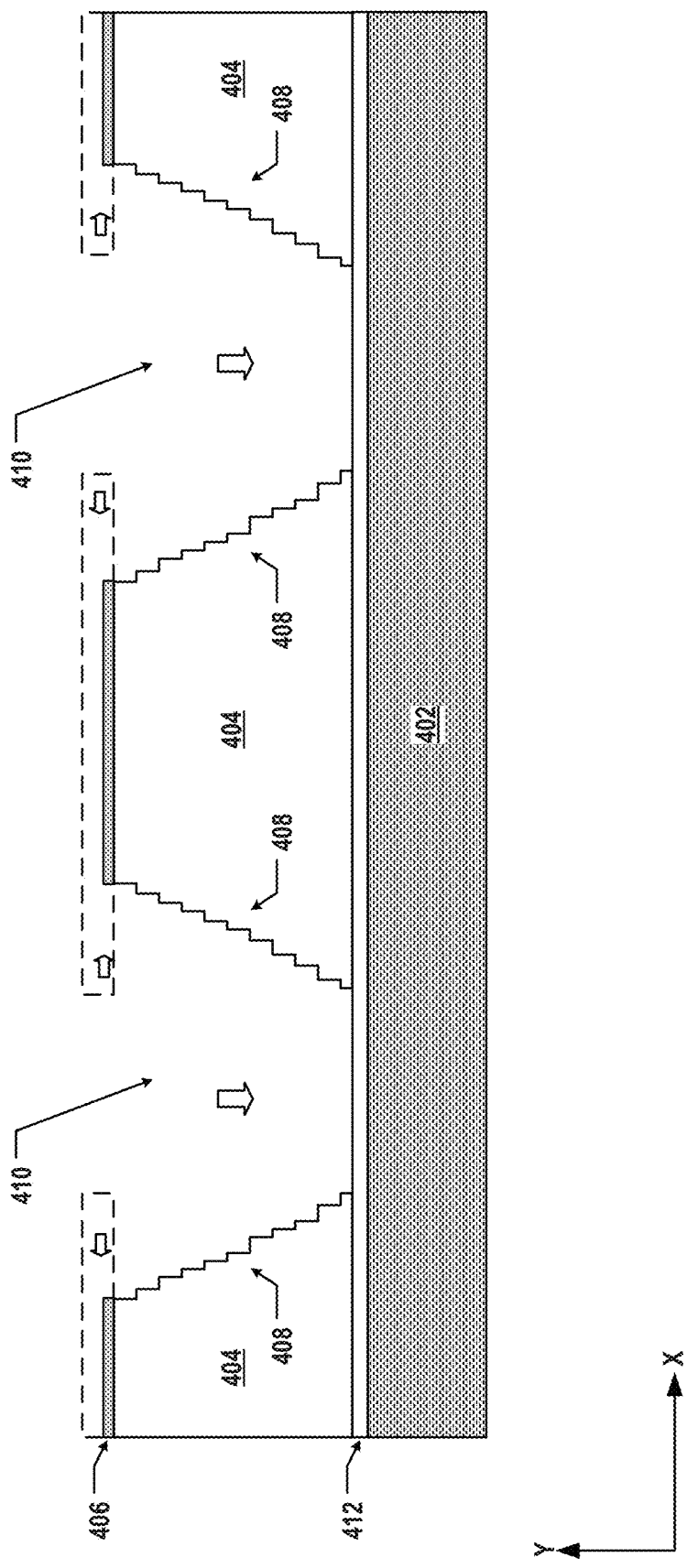

As illustrated in FIG. 4C, the trim-etch cycle of dielectric layer 404 is repeated until the etching reaches substrate 402. Consequently, recesses 410 are formed through dielectric layer 404 to substrate 402 with a plurality of step structures 408 at the edges of recesses 410. Due to the repeated trim-etch cycles of dielectric layer 404, recess 410 can have tilted side edges and a top aperture larger than the bottom aperture. That is, the aperture of recess 410 incrementally decreases as it goes toward silicon substrate 402. The number of step structures 408 can be determined by the number of trim-etch cycles of dielectric layer 404. The dimensions of each step structure 408 can be determined by the amount of trimmed photoresist layer 406 in each cycle (e.g., determining the width in the lateral direction) and by the thickness of etched dielectric layer 404 in each cycle (e.g., determining the depth/height in the vertical direction). In some embodiments, the amount of trimmed photoresist layer 406 in each cycle is nominally the same, so that the width of each step structure 408 is nominally the same. In some embodiments, the thickness of etched dielectric layer 404 in each cycle is nominally the same, so that the depth/height of each step structure 408 is nominally the same.

As illustrated in FIG. 4C, after recess 410 is patterned, remaining photoresist layer 406 is removed, for example, by polymer ashing, photoresist stripping, and/or wet clean, to clean the outer surfaces (e.g., the top surface and the side edges of recess 410) of dielectric layer 404. A silicon oxide film 412 is formed to cover silicon substrate 402 exposed at the bottom of recess 410. In some embodiments, silicon oxide film 412 is formed by ISSG oxidation of silicon substrate 402, high density plasma (HDP) oxidation deposition, and/or fluorine silicon glass (FSG) oxidation deposition. In some embodiments, silicon oxide film 412 covers not only the bottom of recess 410, but also the outer surfaces (e.g., the top surface and the side edges of recess 410) of dielectric layer 404.

Method 500 proceeds to operation 506, as illustrated in FIG. 5, in which a plurality of dielectric/sacrificial layer pairs are formed on the top surface of the first dielectric layer and filling in the recess. In some embodiments, forming the dielectric/sacrificial layer pairs includes alternatingly depositing dielectric layers and sacrificial layers. The thickness of each dielectric/sacrificial layer pair is nominally the same as the thickness of each step structure at the edge of the recess. Forming the dielectric/sacrificial layer pairs can also include planarizing the deposited dielectric layers and sacrificial layers. In some embodiments, after the planarization, the number of the dielectric/sacrificial layer pairs on the top surface of the first dielectric layer is the same as the number of the dielectric/sacrificial layer pairs in the recess.

Figure 4D:
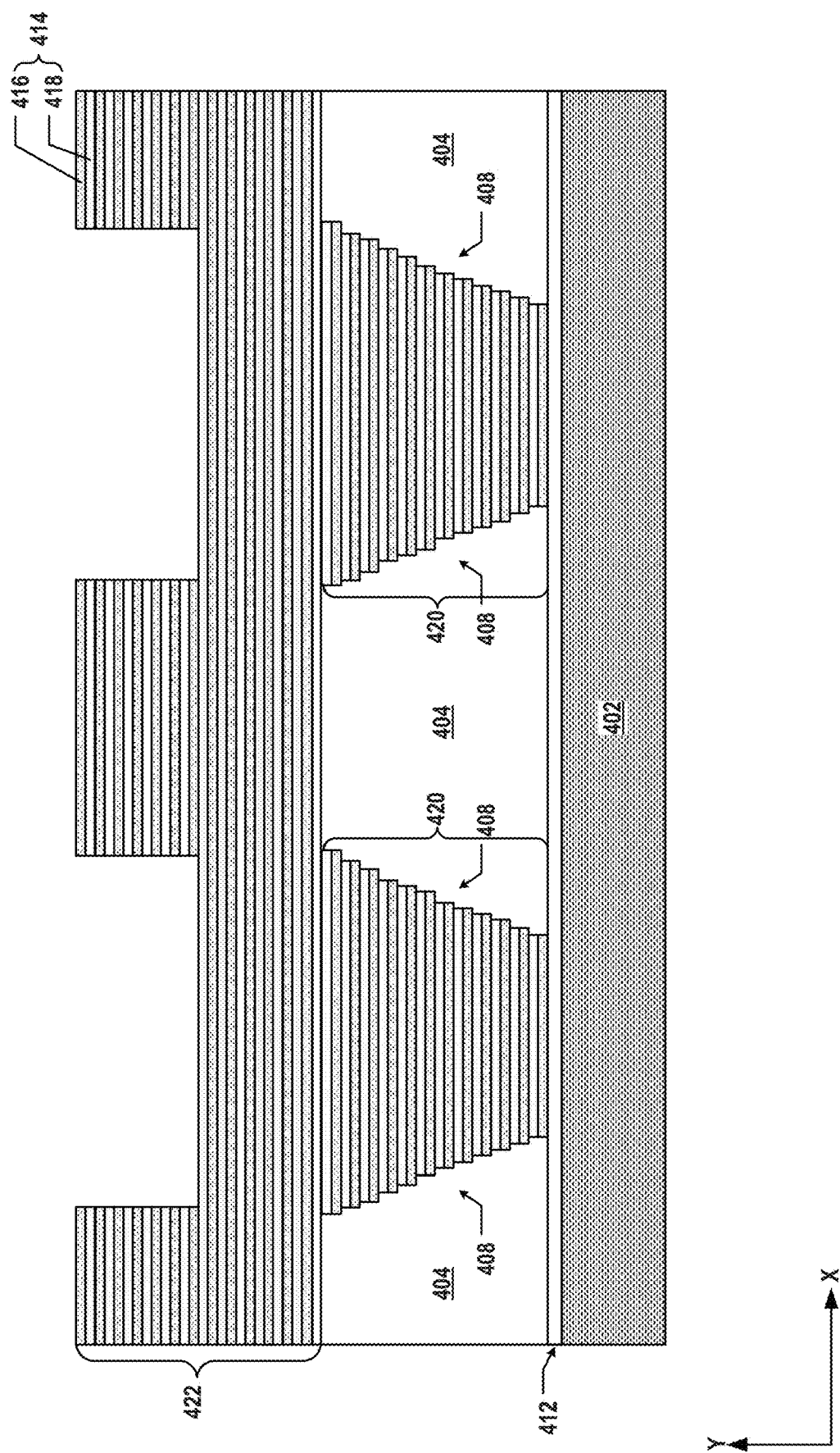

As illustrated in FIG. 4D, a plurality of dielectric/sacrificial layer pairs 414 are formed on the top surface of dielectric layer 404 (also referred to herein as "upper dielectric/sacrificial layer pairs" 422) and filling in recesses 410 (also referred to herein as "lower dielectric/sacrificial layer pairs 420"). In some embodiments, sacrificial layers 416 and dielectric layers 418 are alternatingly deposited by one or more thin film deposition processes including, but not limited to, PVD, CVD, ALD, or any combination thereof. In some embodiments, sacrificial layers 416 include silicon nitride, and dielectric layers 418 include silicon oxide. The deposition rate and/or deposition time can be controlled such that the thickness of each dielectric/sacrificial layer pair 414 (including the total thickness of sacrificial layer 416 and dielectric layer 418) is nominally the same as the depth/height of each step structure 408 at the edges of recess 410. Consequently, lower dielectric/sacrificial layer pairs 420 can include a plurality of step structures 408 at the edges of lower dielectric/sacrificial layer pairs 420.

In some embodiments, the deposition of dielectric/sacrificial layer pairs 414 includes first filling in recess 410 until the top surface of lower dielectric/sacrificial layer pairs 420 flushes with the top surface of dielectric layer 404. The deposition then can continue to form upper dielectric/sacrificial layer pairs 422 on the top surfaces of lower dielectric/sacrificial layer pairs 420 and dielectric layer 404.

It is understood that the sequence of depositing sacrificial layers 416 and dielectric layers 418 is not limited. For depositing lower dielectric/sacrificial layer pairs 420 filling in recesses 410, the deposition can start with sacrificial layer 416 or dielectric layer 418 and end with sacrificial layer 416 or dielectric layer 418. Similarly, for depositing upper dielectric/sacrificial layer pairs 422 on the top surface of dielectric layer 404, the deposition can start with sacrificial layer 416 or dielectric layer 418 and end with sacrificial layer 416 or dielectric layer 418. In FIG. 4D, the number of upper dielectric/sacrificial layer pairs 422 is larger than the number of lower dielectric/sacrificial layer pairs 420 to leave rooms for subsequent planarization.

Figure 4E:
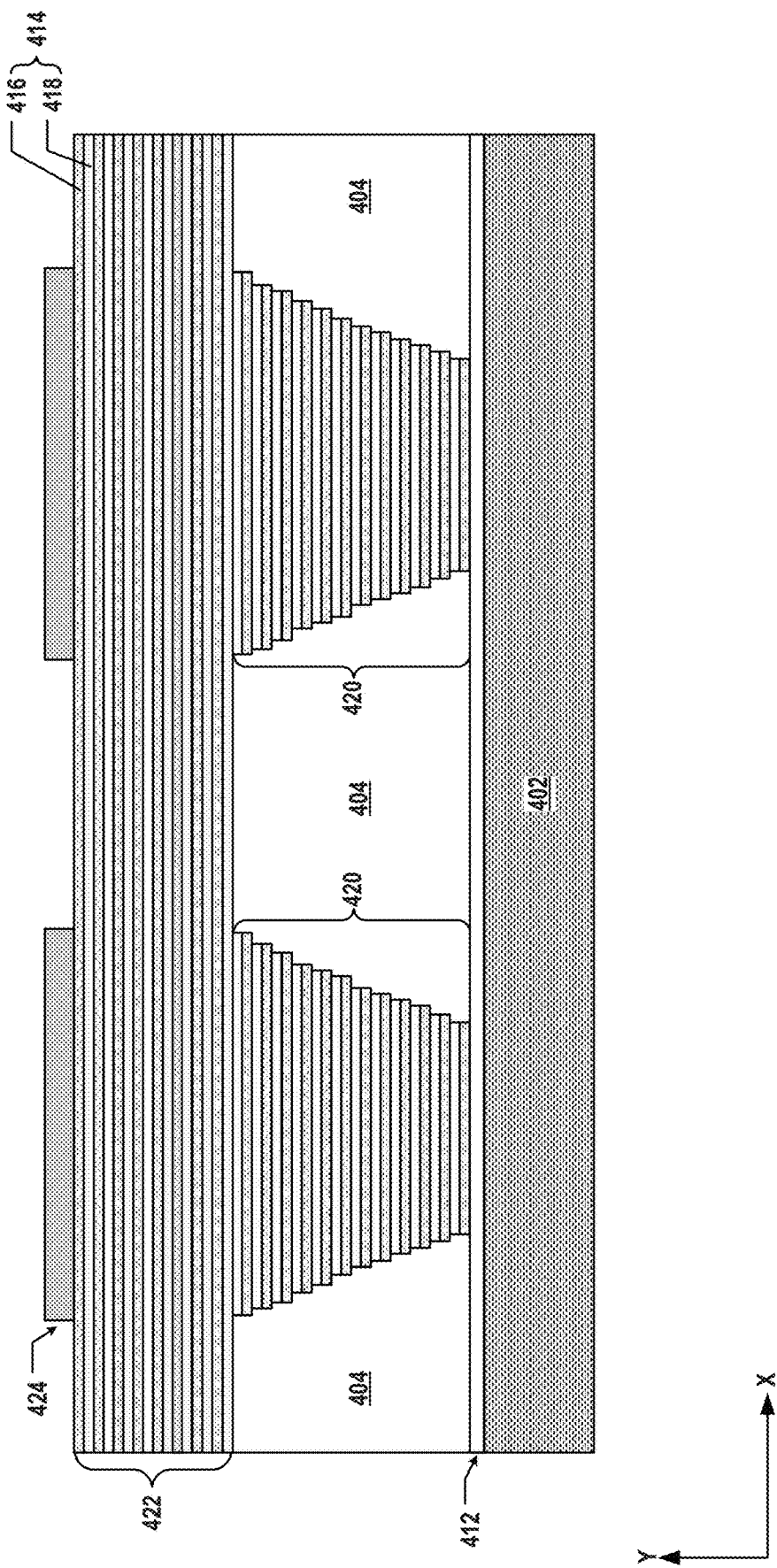

As illustrated in FIG. 4E, upper dielectric/sacrificial layer pairs 422 are planarized by a plurality of processes. For example, a hard mask and a photoresist layer can be deposited and patterned by photolithography and wet/dry etch to fill in the gaps in upper dielectric/sacrificial layer pairs 422, followed by CMP and/or wet/dry etch to remove excess upper dielectric/sacrificial layer pairs 422. In some embodiments, the planarization process is performed to make the number of upper dielectric/sacrificial layer pairs 422 the same as the number of lower dielectric/sacrificial layer pairs 420. It is understood that in some embodiments, the numbers of upper dielectric/sacrificial layer pairs 422 and lower dielectric/sacrificial layer pairs 420 are different.

Method 500 proceeds to operation 508, as illustrated in FIG. 5, in which a second photoresist layer is formed on the top surface of the dielectric/sacrificial layer pairs. As illustrated in FIG. 4E, photoresist layer 424 is formed on the top surface of upper dielectric/sacrificial layer pairs 422 by spin coating and patterned by photolithography and development. Photoresist layer 424 can be any suitable type of positive or negative photoresist. In some embodiments, photoresist layer 424 is patterned to be aligned with the top of lower dielectric/sacrificial layer pairs 420. For example, the same reticles as lower dielectric/sacrificial layer pairs 420 (and recesses 410) can be used, but with opposite photoresist patterns. In some embodiments, a BARC film is deposited between photoresist layer 424 and upper dielectric/sacrificial layer pairs 422 and similarly patterned as photoresist layer 424.

Method 500 proceeds to operation 510, as illustrated in FIG. 5, in which the dielectric/sacrificial layer pairs are patterned by a plurality cycles of trimming the second photoresist layer and etching the plurality of dielectric/sacrificial layer pairs. In some embodiments, patterning the dielectric/sacrificial layer pairs includes patterning the second photoresist layer to expose a portion of a first dielectric/sacrificial layer pair (e.g., the top dielectric/sacrificial layer pair), and etching the exposed portion of the first dielectric/sacrificial layer pair using the patterned second photoresist layer as an etch mask to expose a second dielectric/sacrificial layer pair (e.g., the one beneath the top dielectric/sacrificial layer pair). In each trim-etch cycle, the second photoresist layer is trimmed to expose another portion of the first dielectric/sacrificial layer pair, and the exposed portions of the first and second dielectric/sacrificial layer pairs are etched using the trimmed second photoresist layer as another etch mask to form a step structure at an edge of the dielectric/sacrificial layer pairs, according to some embodiments. The trim-etch cycle can be repeated until the etching reaches the top surface of the first dielectric layer and results in a plurality of step structures at the edge of the dielectric/sacrificial layer pairs. In some embodiments, the amount of the trimmed second photoresist layer is nominally the same in each trim-etch cycle, and the width of each step structure is nominally the same as well.

As illustrated in FIG. 4E, photoresist layer 424 is patterned to expose portions of the top one of upper dielectric/sacrificial layer pairs 422. Patterned photoresist layer 424 is used as an etch mask to etch the exposed portions of the top one of upper dielectric/sacrificial layer pairs 422 by wet etch and/or dry etch. Any suitable etchants (e.g., of wet etch and/or dry etch) can be used to remove the entire thickness of the top one of dielectric/sacrificial layer pairs 414 in the exposed portions (including sacrificial layer 416 and dielectric layer 418 therein). The etched thickness can be controlled by etch-stop at different materials (e.g., silicon nitride and silicon oxide) used in dielectric/sacrificial layer pair 414. The etching of the exposed portions of the top one of upper dielectric/sacrificial layer pairs 422 results in the exposure of portions of the one beneath the top one of upper dielectric/sacrificial layer pairs 422.

Figure 4F:
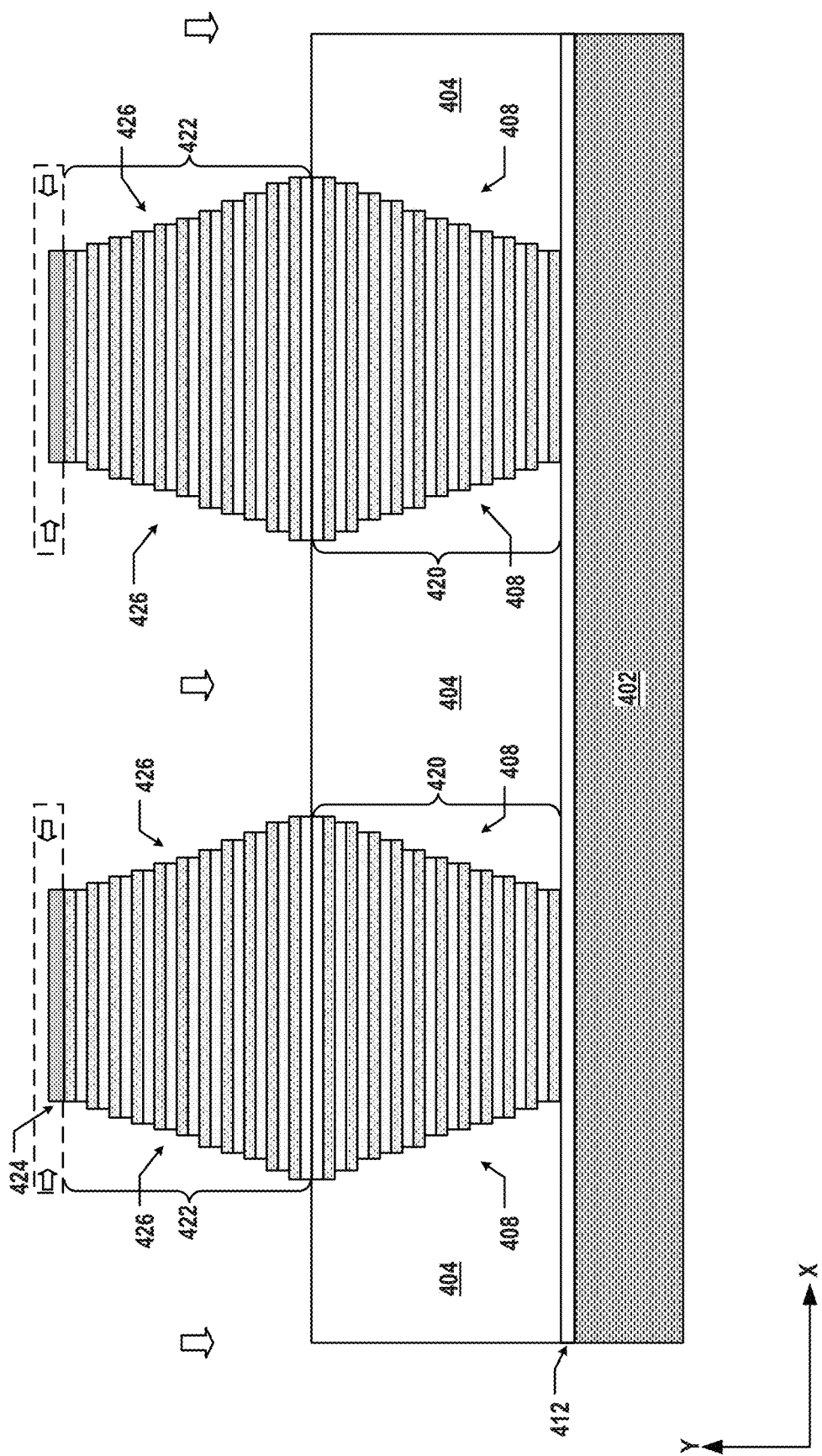

As illustrated in FIG. 4F, patterned photoresist layer 424 is then trimmed (e.g., etched incrementally and inwardly, often from all directions) to expose another portion of the top one of upper dielectric/sacrificial layer pairs 422 (as indicated by the lateral arrows). The amount of photoresist layer 424 trimmed can be controlled by trim rate and/or trim time and can be directly relevant (e.g., determinant) to the dimensions of the resulting step structures 426. The trim of photoresist layer 424 can be performed using any suitable etch process, e.g., an isotropic dry etch or a wet etch. Both the enlarged exposed portions of the top one of upper dielectric/sacrificial layer pairs 422 and the exposed portions of the one beneath the top one of upper dielectric/sacrificial layer pairs 422 are etched using trimmed photoresist layer 424 as an etch mask to form one step structure 426. Any suitable etchants (e.g., of wet etch and/or dry etch) can be used to remove the entire thickness of dielectric/sacrificial layer pair 414 in the exposed portions (including sacrificial layer 416 and dielectric layer 418 therein) toward silicon substrate 402 (as indicated by the vertical arrows). The trim process of photoresist layer 424 followed by the etch process of dielectric/sacrificial layer pair 414 is referred to herein as a trim-etch cycle of dielectric/sacrificial layer pair 414.

As illustrated in FIG. 4F, the trim-etch cycle of dielectric/sacrificial layer pair 414 is repeated until the etching reaches the top surface of dielectric layer 404 (i.e., finishing the etching of the bottom one of upper dielectric/sacrificial layer pairs 422). Consequently, upper dielectric/sacrificial layer pairs 422 are patterned with a plurality of step structures 426 at the edges of upper dielectric/sacrificial layer pairs 422. Due to the repeated trim-etch cycles of dielectric/sacrificial layer pair 414, upper dielectric/sacrificial layer pairs 422 can have tilted side edges and a top dielectric/sacrificial layer pair smaller than the bottom one. That is, the length of each one of upper dielectric/sacrificial layer pairs 422 incrementally increases as it goes toward silicon substrate 402. The number of step structures 426 can be determined by the number of trim-etch cycles of dielectric/sacrificial layer pair 414. The dimensions of each step structure 426 can be determined by the amount of trimmed photoresist layer 424 in each cycle (e.g., determining the width in the lateral direction) and by the thickness of dielectric/sacrificial layer pair 414 (e.g., determining the depth/height in the vertical direction). In some embodiments, the amount of trimmed photoresist layer 424 in each cycle is nominally the same, so that the width of each step structure 426 is nominally the same. In some embodiments, the thickness of dielectric/sacrificial layer pair 414 is nominally the same, so that the depth/height of each step structure 426 is nominally the same.

Method 500 proceeds to operation 512, as illustrated in FIG. 5, in which a second dielectric layer is formed on the top surface of the first dielectric layer and covering the patterned plurality of dielectric/sacrificial layer pairs. Forming the second dielectric layer can include depositing a silicon oxide film and planarizing the silicon oxide film.

Figure 4G:
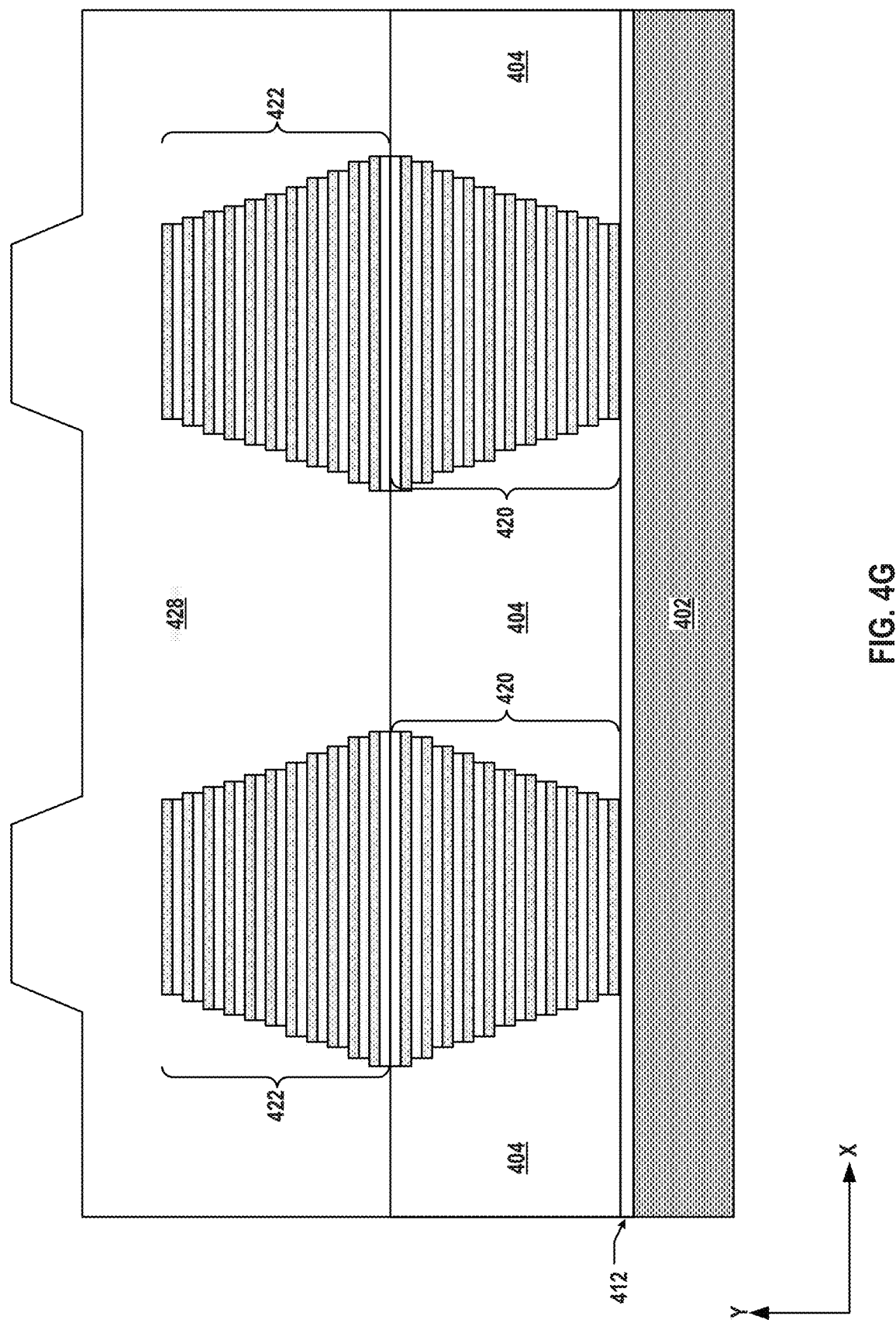
Figure 4H:
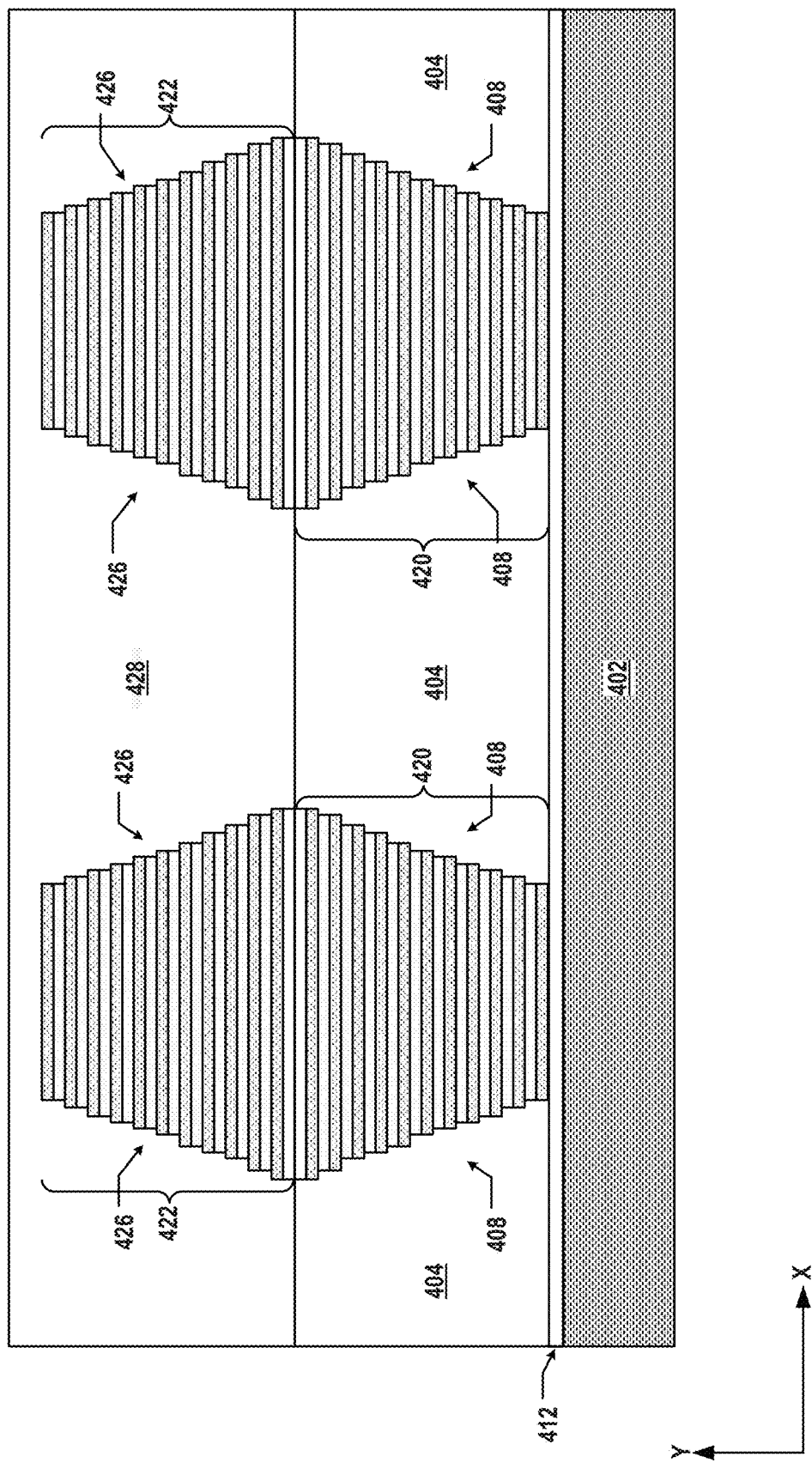

As illustrated in FIG. 4G, a dielectric layer 428 is formed on the top surface of dielectric layer 404 and covering patterned upper dielectric/sacrificial layer pairs 422. Dielectric layer 428 can include silicon oxide, such as TEOS silicon oxide, or any other dielectric materials including, but not limited to, silicon nitride, silicon oxynitride, or any combination thereof. Dielectric layer 428 can be formed by one or more thin film deposition processes including, but not limited to, CVD, PVD, ALD, spin coating, or any combination thereof. In some embodiments, an HDP and/or FSG silicon oxide film is deposited between dielectric layer 428 and dielectric layer 404 (and between dielectric layer 428 and patterned upper dielectric/sacrificial layer pairs 422). As illustrated in FIG. 4H, dielectric layer 428 is planarized by a plurality of processes. For example, a hard mask and a photoresist layer can be deposited and patterned by photolithography and wet/dry etch to fill in the gaps in dielectric layer 428, followed by CMP and/or wet/dry etch to remove excess dielectric layer 428.

Method 500 proceeds to operation 514, as illustrated in FIG. 5, in which a memory stack including a plurality of conductor/dielectric layer pairs is formed on the substrate by replacing, with a plurality of conductor layers, the sacrificial layers in the patterned dielectric/sacrificial layer pairs on the top surface of the first dielectric layer and the dielectric/sacrificial layer pairs in the recess. The process is also known as "gate replacement process." In some embodiments, the gate replacement process includes etching a plurality of openings through the dielectric/sacrificial layer pairs, etching the sacrificial layers in the dielectric/sacrificial layer pairs through the openings, and depositing the conductor layers in the conductor/dielectric layer pairs through the openings.

Figure 4I:
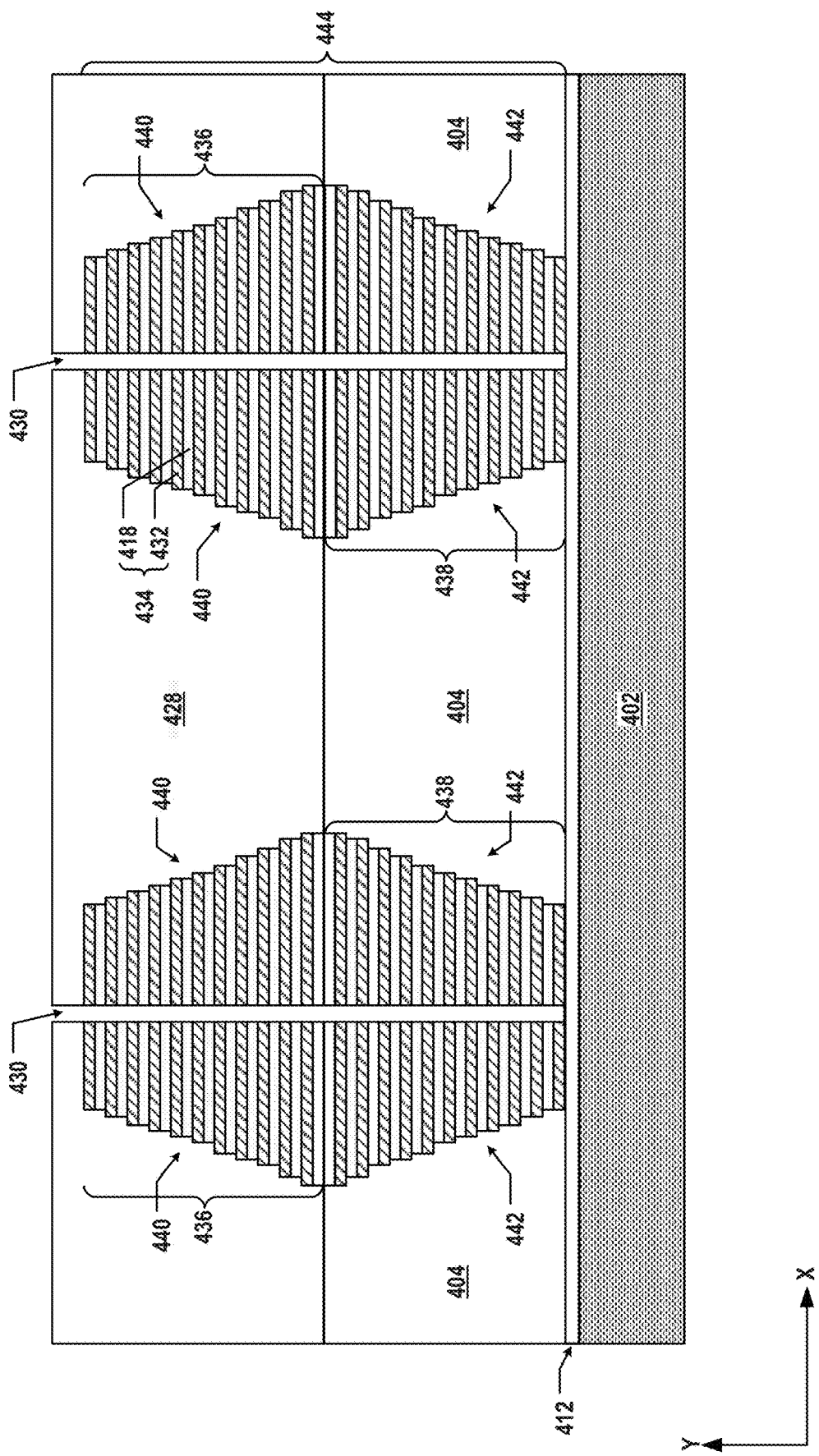

As illustrated in FIG. 4I, openings 430 (e.g., gate line slits) are etched through patterned upper dielectric/sacrificial layer pairs 422 and lower dielectric/sacrificial layer pairs 420. Openings 430 can be formed by wet etching and/or dry etching of dielectrics (e.g., silicon oxide and silicon nitride). Openings 430 are used as pathways for gate replacement process that replaces sacrificial layers 416 in patterned upper dielectric/sacrificial layer pairs 422 and lower dielectric/sacrificial layer pairs 420 with conductor layers 432 to form a plurality of conductor/dielectric layer pairs 434. The replacement of sacrificial layers 416 with conductor layers 432 can be performed by wet etching sacrificial layers 416 (e.g., silicon nitride) selective to dielectric layers 418 (e.g., silicon oxide) and filling the structure with conductor layers 432 (e.g., W). Conductor layers 432 can be deposited by PVD, CVD, ALD, any other suitable process, or any combination thereof. Conductor layers 432 can include conductive materials including, but not limited to, W, Co, Cu, Al, polysilicon, silicides, or any combination thereof.

As a result, after the gate replacement process, patterned upper dielectric/sacrificial layer pairs 422 in FIG. 4H become an upper memory stack 436 (e.g., part of memory stack 104 in upper deck 128 in FIG. 1), and lower dielectric/sacrificial layer pairs 420 in FIG. 4H become a lower memory stack 438 (e.g., part of memory stack 104 in lower deck 126 in FIG. 1). Upper memory stack 436 and lower memory stack 438 together become a memory stack 444 (e.g., memory stack 104 in FIG. 1) having a substantially hexagon shape in the side view. Step structures 426 at the edges of patterned upper dielectric/sacrificial layer pairs 422 in FIG. 4H become staircase structures 440 of upper memory stack 436 (e.g., second and fourth staircase structures 124B and 124D in FIG. 1), and step structures 408 at the edges of lower dielectric/sacrificial layer pairs 420 in FIG. 4H become staircase structures 442 of lower memory stack 438 (e.g., first and third staircase structures 124A and 124C in FIG. 1). It is understood that details of forming other components in memory stack 444 (e.g., NAND memory strings) and local interconnects (e.g., word line via contacts) can be readily appreciated and thus, are not described herein.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a substrate;
a memory stack disposed on the substrate and comprising a plurality of conductor/dielectric pairs, wherein the conductor/dielectric pairs comprise a plurality of conductor layers and dielectric layers stacked alternatingly; and
an array of memory strings each extending vertically through an inner region of the memory stack,
wherein an outer region of the memory stack comprises a first staircase structure disposed on the substrate and a second staircase structure disposed above the first staircase structure;
first edges of the plurality of conductor/dielectric layer pairs in the first staircase structure along a vertical direction away from the substrate are staggered laterally away from the array of memory strings; and second edges of the plurality of conductor/dielectric layer pairs in the second staircase structure along the vertical direction away from the substrate are staggered laterally toward the array of memory strings.

2. The 3D memory device of claim 1, wherein:
the outer region of the memory stack further comprises a third staircase structure disposed on the substrate and a fourth staircase structure disposed above the third staircase structure;
third edges of the plurality of conductor/dielectric layer pairs in the third staircase structure along the vertical direction away from the substrate are staggered laterally away from the array of memory strings; and
fourth edges of the plurality of conductor/dielectric layer pairs in the fourth staircase structure along the vertical direction away from the substrate are staggered laterally toward the array of memory strings.

3. The 3D memory device of claim 1, wherein a length of each of the conductor/dielectric layer pairs decreases from a middle conductor/dielectric layer pair toward top and bottom conductor/dielectric layer pairs, respectively.

4. The 3D memory device of claim 2, wherein a first number of the conductor/dielectric layer pairs in each of the first and third staircase structures is the same, and a second number of the conductor/dielectric layer pairs in each of the second and fourth staircase structures is the same.

5. The 3D memory device of claim 4, wherein the first number is the same as the second number.

6. The 3D memory device of claim 1, further comprising:
a first interconnect layer disposed below the memory stack; and
a plurality of first via contacts each in contact with a conductor layer in one of the conductor/dielectric layer pairs in the first staircase structure, the first via contacts each electrically connected to the first interconnect layer.

7. The 3D memory device of claim 6, wherein:
the first interconnect layer and the memory stack are disposed at opposite sides of the substrate; and
the 3D memory device further comprises a plurality of second via contacts each extending through the substrate and electrically connected to the first interconnect layer and one of the first via contacts.

8. The 3D memory device of claim 1, further comprising:
a second interconnect layer disposed above the memory stack; and
a plurality of third via contacts each in contact with a conductor layer in one of the conductor/dielectric layer pairs in the second staircase structure, the third via contacts each electrically connected to the second interconnect layer.

9. The 3D memory device of claim 1, wherein:
the first edges of each adjacent conductor/dielectric layer pairs in the first staircase structure are staggered laterally away from the array of memory strings, and
the second edges of each adjacent conductor/dielectric layer pairs in the second staircase structure are staggered laterally toward the array of memory strings.

10. The 3D memory device of claim 9, wherein an offset of the first edges of each adjacent conductor/dielectric layer pairs in the first staircase structure is the same as an offset of the second edges of each adjacent conductor/dielectric layer pairs in the second staircase structure.

11. The 3D memory device of claim 1, wherein the memory stack has a substantial hexagon shape in a side view.

12. A three-dimensional (3D) memory device, comprising:
a substrate;
a memory stack disposed on the substrate and comprising a plurality of conductor/dielectric pairs, wherein the conductor/dielectric pairs comprise a plurality of conductor layers and dielectric layers stacked alternatingly, and
a length of each conductor/dielectric layer pair decreases from a middle of the memory stack to a bottom of the memory stack, wherein the bottom of the memory stack is adjacent to the substrate; and
an array of memory strings each extending vertically through an inner region of the memory stack,
wherein an outer region of the memory stack comprises a first staircase structure disposed on the substrate and a second staircase structure disposed on the substrate;
first edges of the plurality of conductor/dielectric layer pairs in the first staircase structure along a vertical direction away from the substrate are staggered laterally away from the array of memory strings; and
second edges of the plurality of conductor/dielectric layer pairs in the second staircase structure along the vertical direction away from the substrate are staggered laterally away from the array of memory strings.

13. A three-dimensional (3D) memory device, comprising:
a substrate;
a memory stack disposed above the substrate and comprising a plurality of conductor/dielectric pairs, wherein the conductor/dielectric pairs comprise a plurality of conductor layers and dielectric layers stacked alternatingly, and wherein a length of each of the conductor/dielectric layer pairs decreases from a middle conductor/dielectric layer pair toward a top conductor/dielectric layer pair and a bottom conductor/dielectric layer pair, respectively; and
an array of memory strings each extending vertically through the memory stack.

14. The 3D memory device of claim 13, further comprising:
a first interconnect layer disposed above the memory stack; and
a plurality of first via contacts in contact with the conductor layers in some of the conductor/dielectric layer pairs, respectively, the first via contacts electrically connected to the first interconnect layer.

15. The 3D memory device of claim 13, further comprising:
a second interconnect layer disposed below the memory stack; and
a plurality of second via contacts in contact with the conductor layers in some of the conductor/dielectric layer pairs, respectively, the second via contacts electrically connected to the second interconnect layer.

16. The 3D memory device of claim 15, wherein:
the second interconnect layer and the memory stack are disposed at opposite sides of the substrate; and
the 3D memory device further comprises a plurality of third via contacts extending through the substrate and electrically connected to the second interconnect layer and the second via contacts.

17. The 3D memory device of claim 13, wherein:
first edges of one side of each adjacent conductor/dielectric layer pairs are staggered laterally; and
second edges on another side of each adjacent conductor/dielectric layer pairs are staggered laterally.

18. The 3D memory device of claim 17, wherein:
a first offset of the first edges of each adjacent conductor/
   dielectric layer pairs is the same; and
a second offset of the second edges of each adjacent
   conductor/dielectric layer pairs is the same.

19. The 3D memory device of claim 18, wherein the first offset if the same as the second offset.

20. The 3D memory device of claim 13, wherein the memory stack has a substantially substantial hexagon shape in a side view.

\* \* \* \* \*